United States Patent [19]

Feistel

[11] 4,223,272
[45] Sep. 16, 1980

[54] FOUR-TERMINAL NETWORK OF ADJUSTABLE TRANSFER FUNCTION

[75] Inventor: Karl H. Feistel, Nürnberg-Röthenbach, Fed. Rep. of Germany

[73] Assignee: Wandel & Goltermann GmbH & Co., Eningen, Fed. Rep. of Germany

[21] Appl. No.: 954,665

[22] Filed: Oct. 25, 1978

[30] Foreign Application Priority Data

Oct. 26, 1977 [DE] Fed. Rep. of Germany ....... 2747857

[51] Int. Cl.² .............................................. H03F 1/34
[52] U.S. Cl. ...................................... 330/51; 330/65; 330/107; 330/148
[58] Field of Search ..................... 330/65, 66, 51, 107, 330/109, 148, 294

[56] References Cited

U.S. PATENT DOCUMENTS

| | | | |
|---|---|---|---|
| 3,769,606 | 10/1973 | Henegar | 330/66 |
| 3,883,830 | 5/1975 | Hekiman | 330/107 X |
| 4,085,380 | 4/1978 | Williford | 330/51 X |

OTHER PUBLICATIONS

Tietze et al, *Halbleiter-Schaltungsteckwik*, Third Edition, 1974, pp. 357, 358.

*Primary Examiner*—James B. Mullins
*Attorney, Agent, or Firm*—Karl F. Ross

[57] ABSTRACT

A four-terminal network selectively convertible into a low-pass, high-pass, band-pass, all-pass or band-stop filter comprises three cascaded stages each including an operational amplifier with a grounded noninverting input, the amplifiers of the first two stages being of the integrating type provided with capacitive feedback circuits. Resistive feedback connections extend from a main output A of the third stage to the inverting inputs of the first and third stages and from a relatively inverted output A' of the third stage to the inverting input of the second stage, their respective resistances $R_u$, $R_v$, $R_w$ determining the coefficients of the denominator in a biquadratic equation $$H(p) = \frac{a + bp + cp^2}{u + vp + wp^2}$$

where $H(p)$ is the transfer function of the network and $p = jf/f_n$ is given by the ratio of an operating frequency $f$ to a reference frequency $f_o$. The coefficients of the numerator, which could be of either sign and may also be zero, are determined by supply resistances $R_a$, $R_b$, $R_c$ connected to the inverting inputs of the several amplifiers, these resistances being switchable to either of two input terminals carrying two relatively inverted signal waves. The feedback capacitances of the first two stages lie in series with respective coupling input resistors of the immediately following stages and determine therewith the reference frequency $f_o$ which can therefore be changed by varying the relative magnitudes of these parameters, either directly or through interposition of adjustable ancillary amplifiers. The supply and feedback resistances may be part of interchangeable modular inserts establishing different signal-transmission modes.

8 Claims, 12 Drawing Figures

FOUR-TERMINAL NETWORK OF ADJUSTABLE TRANSFER FUNCTION

FIELD OF THE INVENTION

My present invention relates to a four-terminal network or quadrupole for telecommunication or measuring purposes whose transfer function H(p) substantially satisfies the quadratic equation $$H(p) = \frac{a + bp + cp^2}{u + vp + wp^2}, \qquad (1)$$

p being given by $j\Omega = j\omega/\omega_n = jf/f_o$ where $\omega = 2\pi f$ is the pulsatance of an incoming signal wave, $\omega_o = 2\pi f_o$ is a calibrating pulsatance and a, b, c, u, v, w are constants.

BACKGROUND OF THE INVENTION

With suitable choice of these constants a, b, c, u, v, w, various transmission properties such as attenuation, phase shift and group delay may be established for a quadrupole of this type used for selective filtering, line matching, noise measurements, voice analysis etc. The numerator coefficients a, b, c may be of either sign (or possibly zero) whereas the denominator coefficients u, v, w are all positive except that w may be zero in a limiting case. A second-order filter conforming to the transfer function of equation (1) can be realized by means of three cascaded stages each including an operational amplifier as is well known per se, e.g. from U.S. Pat. No. 3,715,679 which discloses an all-pass delay equalizer of this type. More generally, an $n^{th}$-order filter can be constructed from n such cascaded stages, using an integrating amplifier in each stage except the last one; see, for example, the handbook by U. Tietze and Ch. Schenk entitled HALBLEITER-SCHALTUNG-STECHNIK, Third Edition (1974), published by Springer-Verlag, pages 357 and 358.

Circuit arrangements are also known which permit a limited adjustment of such filters, e.g. a switchover between a Bessel and a Butterworth characteristic or a shifting of the limiting or central frequencies of their bands. A more fundamental transformation, e.g. a changeover from a band-pass to an all-pass characteristic, is not realizable with these conventional systems.

OBJECTS OF THE INVENTION

The general object of my present invention is to provide a more versatile network of the above-discussed type adapted to be readily converted into any of a variety of second-order filters differing from one another in their mode of operation (high pass, low pass, band pass, all pass or band stop) and/or in the magnitude of their reference frequency $f_o$.

A related object is to provide convenient means for modifying the transfer function of such a filter in a desired manner by a user not necessarily familiar with the underlying network theory.

SUMMARY OF THE INVENTION

In accordance with my present invention, the several cascaded stages of a second-order filter substantially satisfying equation (1) include a first, a second and a third adder (advantageously in the form of an operational amplifier as known per se) each having input means provided with a supply connection and a feedback connection originating at one of two balanced output terminals of the network, the supply connections of the several adders being selectively extendible by respective switch means to one of two balanced input terminals for receiving either the incoming signal wave or its inversion. The several supply and feedback connections include respective weighting resistances determining the numerator coefficients a, b, c and the denominator coefficients u, v, w of equation (1).

According to a more particular feature of my invention, the adders of the first two stages are integrating operational amplifiers with feedback capacitors which lie in series with respective coupling resistors in the inputs of the next-following stages and define therewith two RC circuits of like time constant determining the calibrating frequency $f_o$. A change in this calibrating frequency, and therefore a shift in the transmission spectrum or operating range of the network, can be carried out independently of the weighting resistances with the aid of adjusting means for jointly varying the time constant of both RC circuits. Such a change in calibrating frequency can also be mathematically converted, through the wellknown Laplace transform, into a modification of the response time of the network to pulses or amplitude jumps. Thus, the various parameters defining the transfer function (signal polarity, time constant and weighting resistances) can be chosen on the basis of either frequency or response time. Such a choice may be made with the aid of a microprocessor programmed to select the proper parameters for any desired signal-transmission mode based on the frequency parameter $\Omega = \omega/\omega_o = f/f_o$ or on an equivalent time parameter $\tau = t/t_o$.

According to another aspect of my invention, the supply and feedback resistances of all the operational amplifiers of the network are part of a modular insert corresponding to a particular transfer function, several such inserts being interchangeably provided for the establishment of different signal-transmission modes between incoming-signal and outgoing-signal terminals of an instrument designed to receive these inserts.

BRIEF DESCRIPTION OF THE DRAWING

The above and other features of my invention will now be described in detail with reference to the accompanying drawing in which:

FIGS. 4b–4g are schematic face views of several modular inserts usable in the instrument of FIG. 4a;

FIG. 5 shows a carrier of weighting resistances forming part of one of the components of the instrument shown in FIG. 4a.

SPECIFIC DESCRIPTION

Figure 1:
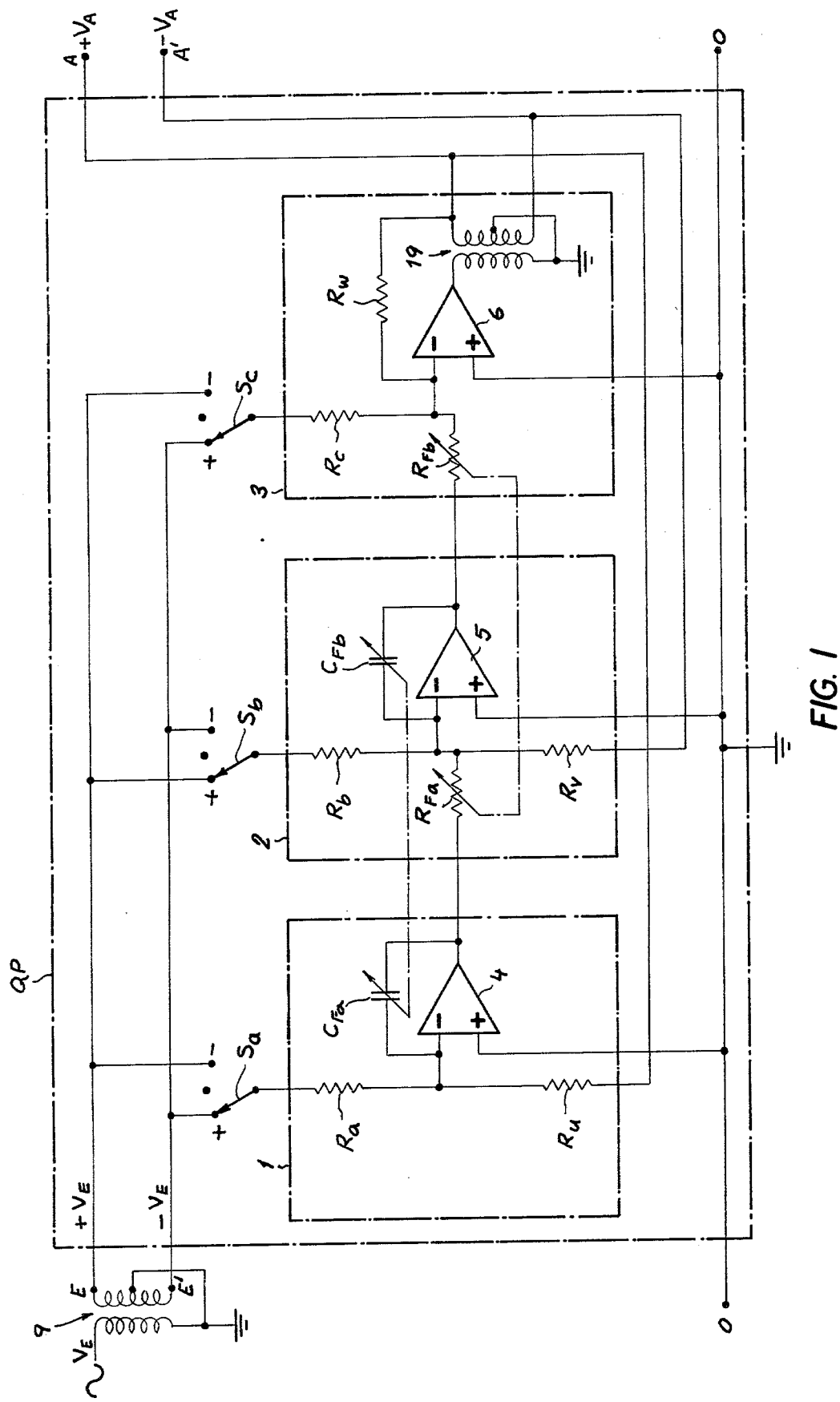
FIG. 1 is a circuit diagram of a quadrupole embodying my invention.

In FIG. 1 I have shown a quadrupole QP with two balanced input terminals E, E' and two balanced output terminals A, A'. An incoming signal wave is fed to terminals E and E' through an inverter 9 shown as a transformer whose secondary has a grounded midpoint. Network QP comprises three cascaded stages 1, 2 and 3 including respective operational amplifiers 4, 5 and 6, each of these amplifiers having a grounded noninverting input. The inverting inputs of amplifiers 4 and 5 are coupled to the corresponding outputs via respective feedback capacitors $C_{Fa}$ and $C_{Fb}$, here shown to be ganged for joint adjustment. The inverting inputs of all three amplifiers are further connected via respective weighting resistances $R_a$, $R_b$, $R_c$ to independently adjustable switches $S_a$, $S_b$, $S_c$ each having a first bank contact (+) tied to one of the input terminals, a second bank contact (−) tied to the other input terminal, and an unconnected third bank contact. Specifically, the "positive" bank contacts of switches $S_a$ and $S_c$ associated with the odd-numbered stages 1, 3 receive a signal voltage $-V_E$ from terminal E' while the corresponding bank contact of switch $S_b$ receives the relatively inverted signal voltage $+V_E$ from terminal E. Capacitors $C_{Fa}$ and $C_{Fb}$ lie in series with respective coupling resistors $R_{Fa}$ and $R_{Fb}$ connected to the inverting inputs of amplifiers 5 and 6, these latter resistors being also shown ganged for simultaneous adjustment. The two capacitors form with the associated coupling resistors a pair of RC circuits of the same time constant which can be modified by adjusting either or both of these impedance pairs.

The inverting inputs of the two integrating amplifiers 4, 5 and the nonintegrating amplifier 6 are further provided with feedback connections including respective weighting resistances $R_u$, $R_v$ and $R_w$, these connections originating at terminal A in the case of the two odd-numbered stages 1, 3 and at terminal A' in the case of intervening stage 2. Output terminals A and A' are energized in balanced relationship through an inverter 19 shown as a transformer similar to that of inverter 9. Thus, terminals A and A' carry relatively inverted outgoing signals $+V_A$ and $-V_A$.

The magnitudes of supply resistances $R_a$, $R_b$ and $R_c$ respectively determine the coefficients a, b and c in the numerator of equation (1). Similarly, feedback resistances $R_u$, $R_v$, $R_w$ respectively determine the corresponding denominator coefficients u, v and w. To facilitate the establishment of a desired transfer function, each of these six weighting resistances may be mechanically or electronically adjustable or bodily replaceable by a different weighting resistance of predetermined magnitude. Switches $S_a$, $S_b$, $S_c$ provide a choice of the sign of the corresponding numerator coefficients; in their intermediate positions they eliminate the respective terms of the numerator, yet obviously at least one switch will have to engage either its "positive" or its "negative" bank contact in order to make the system operative. A possible interrupter in series with resistance $R_w$ has not been illustrated.

In the illustrated switch position, network stage 1 integrates the sum of voltages $-V_E$ and $+V_A$ as weighted by the associated resistances $R_a$ and $R_u$. Its output voltage, passed by resistor $R_{Fa}$, is added to the voltages $+V_E$ and $-V_A$ as weighted by resistances $R_b$ and $R_v$, the sum of all these voltages being integrated in stage 2. The integration period is determined by the aforementioned time constant of coupling circuits $C_{Fa}/R_{Fa}$, $C_{Fb}/R_{Fb}$. Stage 3 sums the output voltage of stage 2, received via resistor $R_{Fb}$, with voltages $-V_E$ and $+V_A$ as weighted by resistances $R_c$ and $R_w$.

The transfer characteristic of network QP, given by the ratio of the signal voltages $V_E$ and $V_A$ (present at the main input and output terminals E and A), can be written as follows:

$$\frac{V_A(\omega)}{V_E(\omega)} = \frac{\frac{R}{R_a} + \frac{R}{R_b} j\omega C_F R_F + \frac{R}{R_c}(j\omega C_F R_F)^2}{\frac{R}{R_u} + \frac{R}{R_v} j\omega C_F R_F + \frac{R}{R_w}(j\omega C_F R_F)^2} \quad (2)$$

with $C_F = C_{Fa} = C_{Fb}$ and $R_F = R_{Fa} = R_{Fb}$; the factor R, which cancels out in the equation, represents an arbitrary calibrating resistance.

A comparison of the coefficients of equations (1) and (2) yields the values $|a| = R/R_a$, $|b| = R/R_b$, $|c| = R/R_c$, $u = R/R_u$, $v = R/R_v$ and $w = R/R_w$. Thus, the absolute values of the coefficients of the transfer function vary inversely with the magnitudes of the selected weighting resistances. The calibrating frequency $f_o$ is given by $1/2\pi R_F C_F$ and is independent of these weighting resistances.

Frequency $f_o$ may be changed in coarse steps (e.g. decadically) by an adjustment of capacitances $C_F$ and in fine steps by an adjustment of resistances $R_F$.

Figure 2:
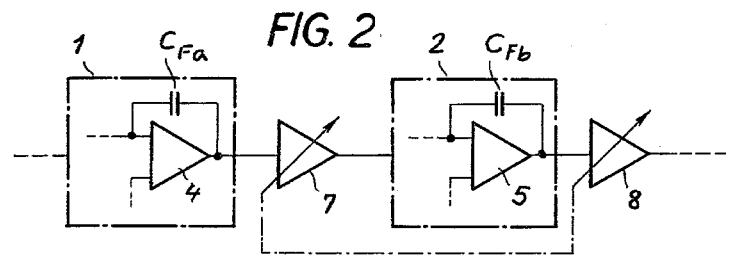
FIG. 2 is a circuit diagram showing a partial modification of the network of FIG. 1.

A modification of the time constant $R_F, C_F$ is also possible with the aid of adjustable ancillary amplifiers 7 and 8, FIG. 2, inserted between the network stages so as to be respectively interposed between coupling capacitors $C_{Fa}$, $C_{Fb}$ on the one hand and coupling resistors $R_{Fa}$, $R_{Fb}$ on the other hand. The magnitudes of these resistors and capacitors may be fixed in that case; the change in the gain of coupling amplifiers 7 and 8 may be carried out by means of adjustable ohmic resistances as is well known per se.

Figure 3:
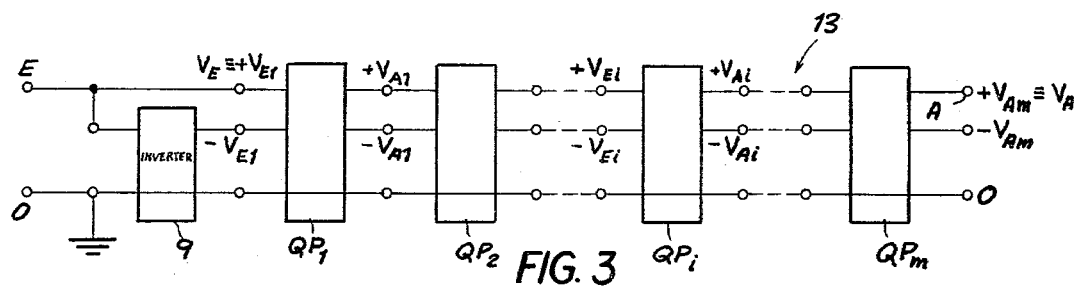
FIG. 3 is a block diagram showing a more elaborate network composed of several quadrupoles of the type illustrated in FIG. 1.

In FIG. 3 I have shown a more complex four-terminal network 13 according to my invention comprising m quadrupoles $QP_1$, $QP_2$, ... $QP_i$, ... $QP_m$ connected in tandem between incoming-signal terminals E, O and outgoing-signal terminals A, O. The incoming signal voltage $V_E$ constitutes the input voltage $+V_{E1}$ of the first quadrupole $QP_1$ further receiving a voltage $-V_{E1}$, relatively phase-shifted by 180°, through the inverter 9. Output voltages $+V_{A1}$ and $-V_{A1}$ constitute respective input voltages of the next quadrupole $QP_2$. There also have been shown the input and output voltages $+V_{Ei}$, $-V_{Ei}$ and $+V_{Ai}$, $-V_{Ai}$ of the intermediate quadrupole $QP_i$ as well as the output voltages $+V_{Am}$ (constituting the outgoing signal $V_A$) and $-V_{Am}$. A ground conductor tied to terminals O is connected, as in FIG. 1, to the noninverting inputs of all the operational amplifiers.

A filter of the 6th order, constituted by three quadrupoles cascaded in the manner illustrated in FIG. 3, has the following transfer function:

$$H(p) = \frac{a_1 + b_1 p + c_1 p^2}{u_1 + v_1 p + w_1 p^2} \cdot \frac{a_2 + b_2 p + c_2 p^2}{u_2 + v_2 p + w_2 p^2} \cdot \frac{a_3 + b_3 p + c_3 p^2}{u_3 + v_3 p + w_3 p^2} \quad (3)$$

For a Butterworth low-pass filter of this type, available tables furnish the following coefficients:

$a_1 = a_2 = a_3 = 1$
$b_1 = b_2 = b_3 = 0$
$c_1 = c_2 = c_3 = 0$
$u_1 = u_2 = u_3 = 1$
$v_1 = 0.518$
$v_2 = 1.414$ $v_3 = 1.932$
$w_1 = w_2 = w_3 = 1$

With an assumed calibrating resistance $R = 1Lk\Omega$, equation (2) yields these values for the several weighting resistances:

$R_{a1} = R_{a2} = R_{a3} = 1k\Omega$
$R_{b1} = R_{b2} = R_{b3} = \infty$
$R_{c1} = R_{c2} = R_{c3} = \infty$
$R_{u1} = R_{u2} = R_{u3} = 1k\Omega$
$R_{v1} = 1.932 k\Omega$
$R_{v2} = 0.707 k\Omega$
$R_{v3} = 0.518 k\Omega$
$R_{w1} = R_{w2} = R_{w3} = 1k\Omega$ The infinite values for the second-stage and third-stage supply resistances $R_{b1}$ etc. and $R_{c1}$ etc. are obtained by an open-circuiting of the corresponding polarity-reversing switches $S_b$ and $S_c$.

Figure 4A:
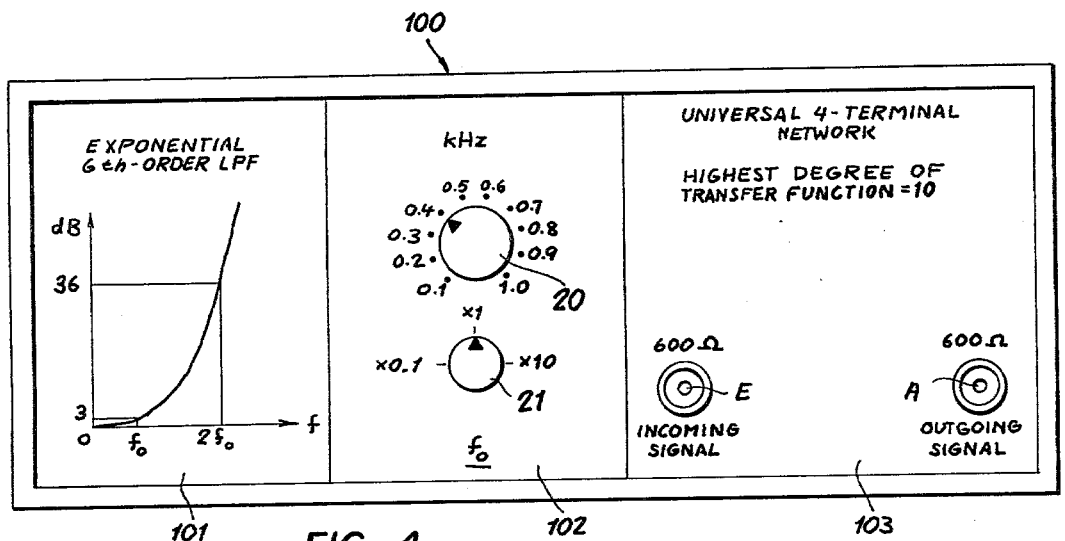
FIG. 4a schematically illustrates the face of an instrument including a network of the type shown in FIG. 3.
Figures 4B, 4C, 4D:
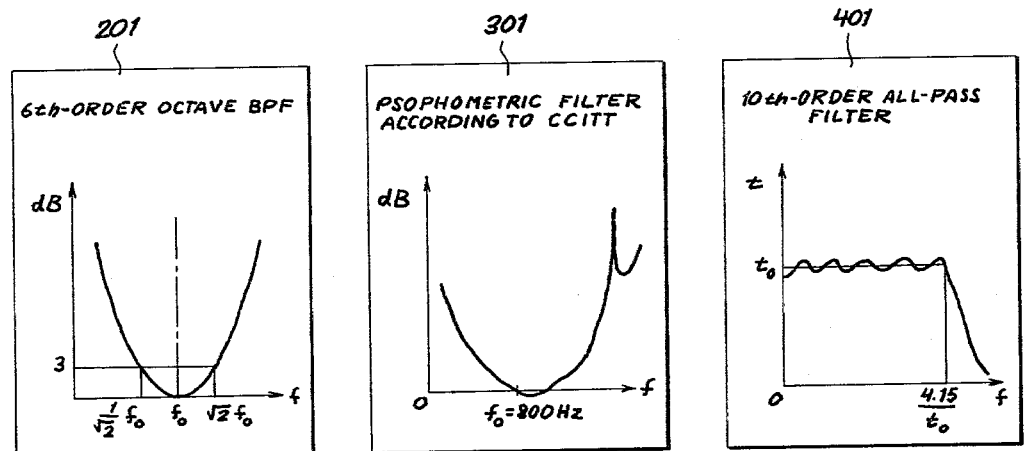

In FIG. 4a I have shown the face of an instrument 100 incorporating a universally adjustable four-terminal filter network with five cascaded quadrupoles providing transfer functions of up to the $10^{th}$ order. The instrument includes modular inserts 101 and 102 as well as a front plate 103 forming part of the instrument housing, that plate carrying the incoming-signal and outgoing-signal terminals E and A. As indicated on this front plate, the network is assumed to have input and output resistances of 600 ohms.

Insert 101 shows the attenuation curve of an exponential $6^{th}$-order low-pass filter, as described above with reference to equation (3), in terms of a calibrating frequency $f_o$ whose magnitude is adjustable with the aid of a pair of knobs 20, 21 on insert 102. Knob 20, which may be coupled with the resistors $R_{Fa}$ and $R_{Fb}$ (FIG. 1) of each constituent quadrupole, varies the calibrating frequency in steps of 10, 100 or 1000 Hz, depending on the setting of knob 21 which may be coupled with the corresponding capacitors $C_{Fa}$ and $C_{Fb}$. Insert 101 may be replaced by other modular inserts 201, 301, 401, 501, 601 respectively shown in FIGS. 4b–4f. An insert 202, shown in FIG. 4g, may be substituted for insert 102 when it is desired to use a calibrating time $t_o$ in lieu of calibrating frequency $f_o$. Insert 202 is provided for this purpose with three digit wheels 22, 23, 24 for selecting a desired time interval, here specifically of 327 ms, and with a knob 25 designed to multiply that time interval in a manner analogous to that of knob 21 of insert 102.

In the particular examples here given, insert 201 contains the weighting resistances for a $6^{th}$-order filter with a 1-octave pass band, to be substituted for the corresponding resistances of insert 101. Insert 301 comprises the resistances required for a psophometric filter conforming to C.C.I.T.T. standards. The resistances of insert 401 establish a $10^{th}$-order all-pass filter whose delay curve is plotted on its front face. Insert 501 provides a $7^{th}$-order pulse shaper with three quadrupoles of second-degree characteristics and one quadrupole of first-degree characteristic (having its feedback resistance $R_w$ open-circuited). It will be convenient to use inserts 101, 201 and 301 jointly with insert 102 and to use inserts 401 and 501 jointly with insert 202; naturally, insert combinations such as 101, 102 or 501, 202, for example, could be combined into a single module. Finally, insert 601 (which could be utilized together with either of inserts 102, 202) has six knobs for directly adjusting the several weighting resistances a, b, c, u, v, w of a single quadrupole and also carries associated switches $S_a$, $S_b$ and $S_c$; this latter insert may be used, for example, on a teaching instrument demonstrating the effect of a modification of any of these parameters upon the transmission of a single frequency as viewed on an oscilloscope or other indicator.

Figure 5:
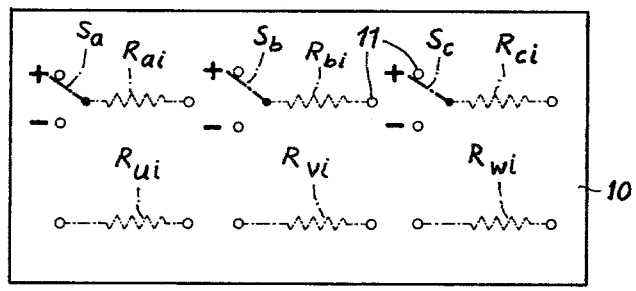
Figures 4E, 4F, 4G:
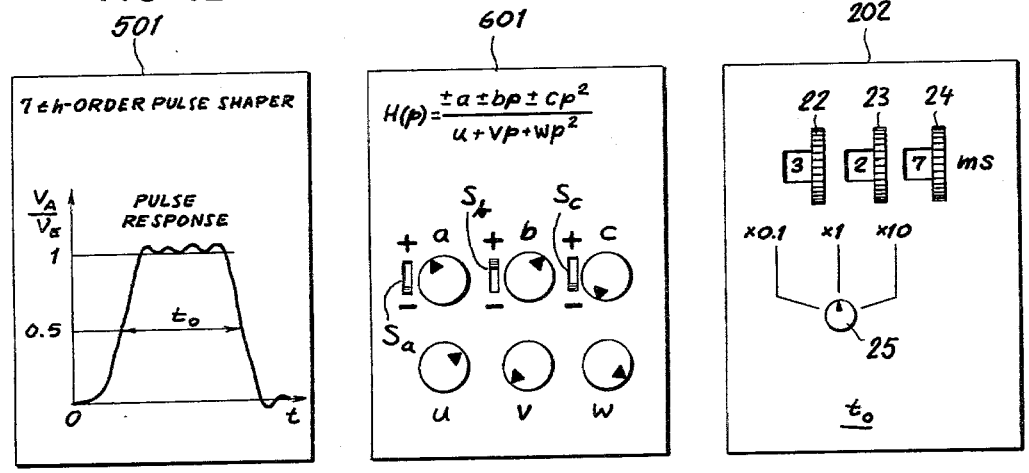

In FIG. 5 I have shown a carrier plate 10 with terminals 11 to which selected resistances $R_{ai}$, $R_{bi}$, $R_{ci}$, $R_{ui}$, $R_{vi}$, $R_{wi}$ may be soldered along with connections $S_a$, $S_b$, $S_c$ replacing the correspondingly designated switches of FIGS. 1 and 4f. A combination of such carrier plates may be used in any of the aforedescribed inserts 101, 201, 301, 401, 501, the terminals 11 of each plate constituting or being connected to plugs receivable in corresponding jacks of the instrument housing for selective coupling of their supply and feedback resistances to the balanced signal channels E, E' and A, A' of each three-stage network section. Thus, an exchange of two carrier plates differing only in the position (or possible absence) of their links $S_a$, $S_b$, $S_c$ would be the equivalent of a change in the corresponding switch position of FIG. 1.

Figure 6:
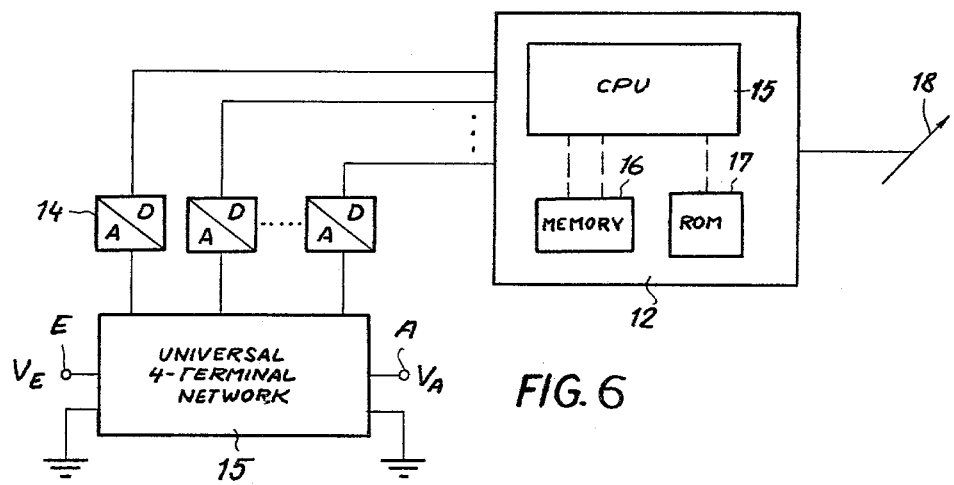
FIG. 6 is a block diagram of a computerized control system for the selective adjustment of a universally adjustable four-terminal network according to my invention.

In FIG. 6 I have shown a microprocessor 12 controlling the adjustment of the universal four-terminal network 13. Microprocessor 12 comprises the usual central processing unit 15, working memory 16 and read-only memory 17. A selector diagrammatically indicated at 18 (which could be a keyboard) feeds the desired signal-transmission mode (e.g. band pass with bandwidth specified in terms of calibrating frequency $f_o$) into the microprocessor 12 which thereupon reads out from ROM 17 the data controlling the setting of the adjustable circuit parameters. These data are transmitted by way of respective digital/analog converters 14 to corresponding control members for mechanically or electronically modifying the several weighting resistances and the time constant of the coupling circuits as described above; no digital/analog conversion will be needed for the setting of polarity-reversing switches $S_a$, $S_b$, $S_c$. The microprocessor 12 can be readily programmed in light of the foregoing formulas and available tables whose contents are to be stored in ROM 17. It will usually be convenient to select the calibrating frequency $f_o$ or calibrating time $t_o$ manually and independently of the microprocessor after establishment of the desired operating mode.

In a semiautomatic control system, the data read out from microprocessor 12 may be translated by a human operator into the requisite settings of the several weighting resistances and polarity-reversing switches.

The principles herein disclosed could be extended to networks or network sections with more than three cascaded operational amplifiers, all but the last one of the integrating type.

I claim:
1. A four-terminal network of adjustable transfer function, comprising:
   a pair of input terminals balanced with reference to a neutral terminal for respective energization with an incoming signal wave and its inverted replica;
   a pair of output terminals balanced with reference to said neutral terminal;
   a plurality of cascaded network components between said input and output terminals including a first adder, a second adder and a third adder each having input means provided with a supply connection and further provided with a feedback connection originating at one of said output terminals, each of said supply connections including a weighting resistance determining a respective coefficient in a numerator of a biquadratic equation representing said transfer function, each of said feedback con- nections including a weighting resistance determining a respective coefficient in a denominator of said biquadratic equation; and first, second and third switch means selectively operable to extend the supply connections of said first, second and third adders to either or neither of said input terminals.

2. A network as defined in claim 1 wherein said first and second adders are integrating first and second operational amplifiers provided with feedback capacitors and said third adder is a nonintegrating third operational amplifier, each of said operational amplifiers having a noninverting input connected to said neutral terminal and an inverting input coupled to said supply and feedback connections thereof, said second and third operational amplifiers having coupling resistors which are respectively in series with the feedback capacitors of said first and second operational amplifiers and define therewith two RC circuits of like time constant determining a reference frequency, the feedback connections of said first and third adders extending from one of said output terminals and the feedback connection to said second adder extending from the other of said output terminals.

3. A network as defined in claim 2 wherein said RC circuits are provided with adjusting means for varying said time constant.

4. A network as defined in claim 3 wherein said adjusting means comprises a pair of ancillary amplifiers inserted between said feedback capacitors and said coupling resistors.

5. A network as defined in claim 1, 2, 3 or 4 wherein said weighting resistances are carried on replaceable modules.

6. In combination, a four-terminal network as defined in claim 1, 2, 3 or 4 selector means for choosing one of several signal-transmission modes for said network, and processor means responsive to said selector means for reading out data specifying corresponding magnitudes for said weighting resistances and and settings for said switch means, said weighting resistances being adjustable in conformity with said magnitudes.

7. An instrument for establishing any of several signal-transmission modes between a pair of incoming-signal terminals and a pair of outgoing-signal terminals, the terminals of each pair being balanced with reference to a neutral point, comprising:

a housing carrying said terminals;

a plurality of cascaded network components between said incoming-signal and outgoing-signal terminals includiung at least three operational amplifiers each having a noninverting input connected to said neutral point and an inverting input connectable via a respective supply resistance to either of said input terminals and via a respective feedback resistance to a specified output terminal different for different components, the supply and feedback resistances of all said operational amplifiers constituting respective coefficients of a transfer function, said components further including coupling impedances independent of said supply and feedback resistances;

a plurality of modular inserts each carrying a set of said supply and feedback resistances corresponding to a particular transfer function, said inserts being interchangeably receivable in said housing for connection to said components and to said terminals; and selector means operatively connected with said coupling impedances for establishing a chosen operating range.

8. An instrument as defined in claim 7 wherein said selector means forms part of a pair of interchangeable inserts providing respective readings in terms of frequency and response time.

* * * * *